United States Patent
Gong et al.

(10) Patent No.: US 9,034,697 B2
(45) Date of Patent: May 19, 2015

(54) APPARATUS AND METHODS FOR QUAD FLAT NO LEAD PACKAGING

(75) Inventors: Zhiwei Gong, Chandler, AZ (US); Jianwen Xu, San Diego, CA (US); Wei Gao, Tianjin (CN); Scott M. Hayes, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 612 days.

(21) Appl. No.: 13/182,710

(22) Filed: Jul. 14, 2011

(65) Prior Publication Data

US 2013/0015566 A1    Jan. 17, 2013

(51) Int. Cl.
*H01L 21/60* (2006.01)
*H01L 21/56* (2006.01)
*H01L 23/495* (2006.01)
*H01L 21/48* (2006.01)
*H01L 23/00* (2006.01)
*H01L 23/31* (2006.01)

(52) U.S. Cl.
CPC ........ *H01L 21/568* (2013.01); *H01L 23/49537* (2013.01); *H01L 23/49548* (2013.01); *H01L 23/49568* (2013.01); *H01L 23/49575* (2013.01); *H01L 21/4821* (2013.01); *H01L 2224/48247* (2013.01); *H01L 24/32* (2013.01); *H01L 24/48* (2013.01); *H01L 2224/32245* (2013.01); *H01L 2224/73265* (2013.01); *H01L 2224/49171* (2013.01); *H01L 23/3107* (2013.01)

(58) Field of Classification Search
CPC ...................... H01L 2/48211; H01L 23/49575
USPC ................................................... 438/106–123
See application file for complete search history.

(56) References Cited

U.S. PATENT DOCUMENTS

| | | | |
|---|---|---|---|
| 5,066,614 A * | 11/1991 | Dunaway et al. | 228/180.21 |
| 5,809,639 A * | 9/1998 | Alvite | 29/740 |
| 6,927,483 B1 * | 8/2005 | Lee et al. | 257/676 |
| 6,951,982 B2 * | 10/2005 | Chye et al. | 174/350 |
| 7,012,324 B2 * | 3/2006 | Li et al. | 257/676 |
| 7,033,866 B2 | 4/2006 | Chow et al. | |
| 7,498,665 B2 | 3/2009 | Alabin et al. | |
| 7,723,163 B2 * | 5/2010 | Xu et al. | 438/123 |
| 8,053,872 B1 * | 11/2011 | Swan et al. | 257/659 |
| 8,329,509 B2 * | 12/2012 | Gong et al. | 438/112 |
| 8,334,584 B2 * | 12/2012 | Camacho et al. | 257/676 |
| 2002/0146864 A1 * | 10/2002 | Miyaki et al. | 438/123 |
| 2003/0164554 A1 * | 9/2003 | Fee et al. | 257/787 |
| 2004/0104456 A1 * | 6/2004 | Duffy et al. | 257/666 |
| 2008/0283980 A1 | 11/2008 | Gao et al. | |
| 2010/0252919 A1 * | 10/2010 | Xu et al. | 257/686 |
| 2012/0292755 A1 * | 11/2012 | Wang | 257/676 |
| 2013/0020690 A1 * | 1/2013 | Qiu et al. | 257/676 |
| 2013/0056861 A1 * | 3/2013 | Gao et al. | 257/675 |

* cited by examiner

*Primary Examiner* — Savitr Mulpuri

(57) ABSTRACT

A method for fabricating a semiconductor package is disclosed that includes providing a supply of lead elements, mounting a plurality of the lead elements on a lead frame until a predetermined number of lead elements are placed on the lead frame, and connecting other components on the lead frame to the lead elements.

10 Claims, 4 Drawing Sheets

APPARATUS AND METHODS FOR QUAD FLAT NO LEAD PACKAGING

BACKGROUND

1. Field

This disclosure relates generally to semiconductor device packaging, and more specifically, to quad flat no lead packaging.

2. Related Art

Array quad flat no lead (QFN) and power QFN (PQFN) packages typically comprises an integrated circuit (IC) die attached and electrically connected to a lead frame with more than one rows of lead terminal. The IC die, the electrical connections and a portion of the lead frame are encapsulated by a mold compound, leaving a portion of the leads exposed. The exposed leads serve as input and output (IO) connections to the encapsulated IC die and are typically located along a periphery of the QFN package. Because QFN packages provide a number of advantages over other lead frame package configurations including, for example, shorter electrical paths and faster signal communication rates, QFN packages are widely used as low pin count solutions for power elements and other IC die.

In the semiconductor industry, array QFN and power QFN (PQFN) packaging typically has two types of lead arrangement: in-line leads and stagger leads. In-line leads require a half saw process to singulate the inner leads with the die flag. However, it is very difficult to control the saw depth during the half saw process due to warpage of the Mold-Array-Process (MAP) type semiconductor package. Half saw process can also introduce quality problems such as metal bur and metal smearing. Stagger leads do not require the half saw process but inner lead supporting bars can be so weak that they are easily deformed during production.

Additionally, there is a strict restriction on minimum lead pitch due to the constraints of etching processes in lead frame production and stiffness required to avoid lead deformation during lead frame production and semiconductor assembly process.

Other limitations of both inline and stagger leads are the difficulties in making multiple rows of leads in applications with high wire density requirements, and making irregular shape and layout of lead terminals, as well as the different thickness and materials between lead terminals and other portions of lead frame.

Lead frames provide a central supporting structure of molded IC packages to which all other elements of the molded IC package are attached. Lead frames are etched or stamped from a thin sheet metal strip to form a pattern of terminals around a central die attach platform upon which a die is mounted using, for example, an epoxy resin. The die includes bonding pads which are electrically connected to the surrounding lead terminals of the frame by fine-diameter conductive wires using well-established wire bond techniques. The assembly including the lead frame, die, and wires are covered with a thermoset plastic casing to complete the molded IC package.

In PQFN packages, a thick lead frame around twenty mils is used for high power dissipation but it is difficult to reduce lead pitch due to constraints of copper etching processes for very thick lead frames. Dual gauge lead frame design, where thick lead frame is stacked on top of a standard thin lead frame, is a solution to address this issue, but the manufacturability of dual gauge lead frames is not as good as the single gauge design, for instance, the dual gauge lead frame often leads to mold compound resin bleed due to the stacking of the lead frames. Moreover, dual gauge lead frames double the cost of lead frame.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Apparatus and methods disclosed herein provide improved manufacturability, enhance design flexibility, and increase lead pad density of QFN and PQFN lead frame packages by adding isolated lead elements to an existing lead frame. The lead elements can be placed by an automated component placement system, also referred to as a pick & place machine or other suitable technique. The lead elements are in addition to terminals that may be pre-formed on the lead frame. The pick and place machine eliminates the half saw process for in-line lead pad design and pitch problems for stagger lead pad design, as well as helping to prevent deformation of a supporting bar on the lead frame. Moreover, adding lead elements to an existing lead frame enhances design flexibility for more than two rows of terminals, different materials or physical dimensions of lead terminals, which otherwise is difficult if not possible through current QFN and PQFN production. Additionally, for PQFN packages, placement of additional lead elements eliminates the need for dual gauge lead frames, and the resin bleed problem for stacked dual gauge lead frames is thereby eliminated.

Figure 1:
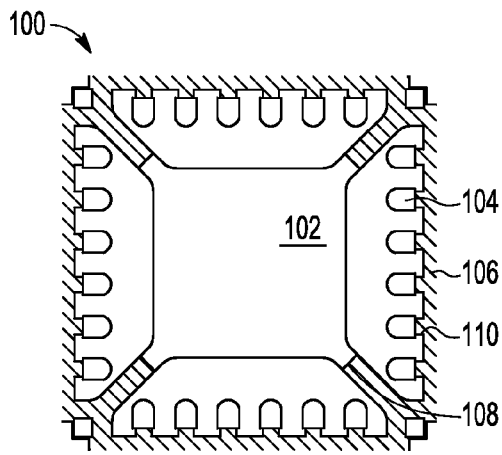
FIG. 1 shows a top view of an embodiment of a lead frame for a quad flat no lead package.

Referring now to FIG. 1, a top view of an embodiment of lead frame 100 for a quad flat no lead (QFN) package is shown having a die receiving area 102, and a row of bond pads or terminals 104 integrally formed around the edges 106 of lead frame 100. The die receiving area 102 is positioned in the center of lead frame 100 and sized and shaped to receive one or more integrated circuit (IC) dies or other components. IC dies (not shown) and other components may include any type of circuitry that perform any suitable type of function. The IC die may be attached to receiving area 102 via an adhesive material such as epoxy, tape, solder, or the like (not shown). The size of die receiving area 102 varies depending on the size of the die. Die receiving area 102 is generally square shaped, although it can have other shapes and be positioned in other locations on lead frame 100. In the particular embodiment shown, each of the corners of the die receiving area 102 is connected to a corresponding corner of the lead frame 100 via respective ones of a plurality of tie bars 108. The terminals 104 extend inwardly (towards the die receiving area 102) from the edges 106 of the lead frame 100 with connection bars 110. In some embodiments, die receiving area 102 is not available and the die is placed directly on to the tape with or without bonding material, e.g. epoxy, in the subsequent process stage.

Figure 2:
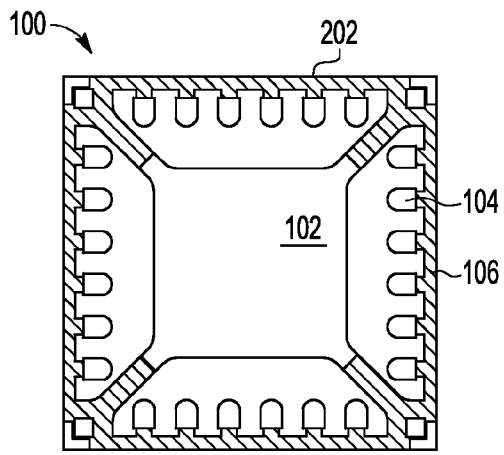
FIG. 2 shows the top view of the lead frame of FIG. 1 in another stage of processing.

Referring to FIG. 2, the top view of lead frame 100 in another stage of processing is shown with removable tape 202 positioned on the backside of lead frame 100 and extending around edges 106. Tape 202 provides support for lead frame 100 and helps prevent flash burrs in encapsulation. Tape 202 is also used to receive the placed lead elements 302 and 402 in a later stage. Tape 202 is removed after attaching surface components, forming wirebonds, and performing encapsulant molding. The encapsulation can be performed by a variety of difference processes, such as, for example, plastic overmolding, conformal coating (e.g. epoxy coating), or any other suitable encapsulation process.

Figure 3:
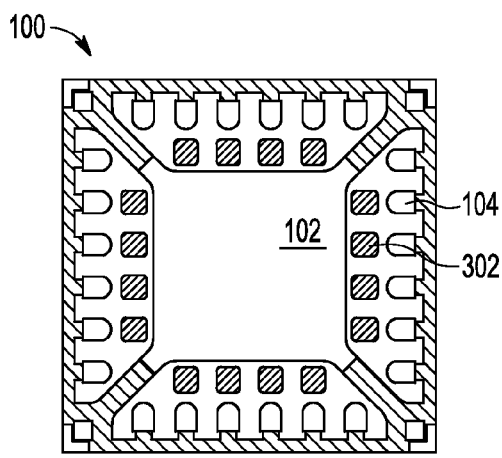
FIG. 3 shows the top view of the lead frame of FIG. 1 in another stage of processing.

Referring to FIGS. 1 and 3, the top view of an embodiment of lead frame 100 in another stage of processing is shown with pre-formed terminals 104 around the outer perimeter of lead frame 100 and a single row of lead elements 302 around an inner perimeter of lead frame 100 adjacent terminals 104. Lead elements 302 and terminals 104 are connected to bond pads or leads on other components during later stages of processing to allow the components in the package to operate with components in other packages on a printed circuit board, or other devices.

A supply of lead elements 302 can be retrieved from a reel of tape, a bin, a chute, or other suitable structure by suction nozzle 906 (FIG. 9), and moved and released on the desired location on lead frame 100. Lead elements 302 can be placed individually. Alternatively, groups of lead elements 302 can be placed simultaneously by such as by using more than one suction nozzle 906 in an automated component placement system (as described in association with FIG. 9 herein). As a further alternative, prearranged groups of lead elements 302 can be configured on a structure such as a piece of adhesive tape that is placed on lead frame 100 to reduce the amount of time required to place lead elements 302 individually.

Lead elements 302 can be positioned on lead frame 100 in various configurations. For example, in FIG. 3, lead frame 100 and die pad 102 are square with a number of terminals 104 formed along the periphery of each side lead frame 100. Lead elements 302 are positioned in single rows around die pad 102 that are closer to the edges of die pad 102 than terminals 104.

Figure 4:
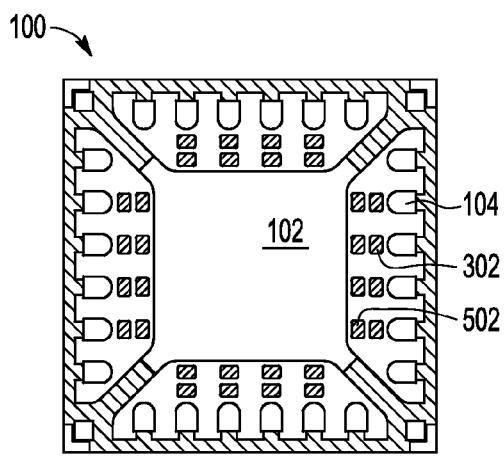
FIG. 4 shows the top view of another embodiment of the lead frame of FIG. 3 with one configuration lead elements.

Referring to FIGS. 1 and 4, FIG. 4 shows the top view of another embodiment of lead frame 100 with additional single rows of lead elements 402 around the periphery of die pad 102. The rows of lead elements 302, 402 are aligned with each other and with terminals 104. The ability to include 2 rows of lead elements 302, 402, and one row of terminals 104 allows a higher density of wire leads to be connected to the IC die and/or other components than lead frames 100 that are stamped or etched. The ability to add lead elements 302, 402 also provides greater flexibility in the placement and number of connections that can be made with IC dies or other components.

Figure 5:
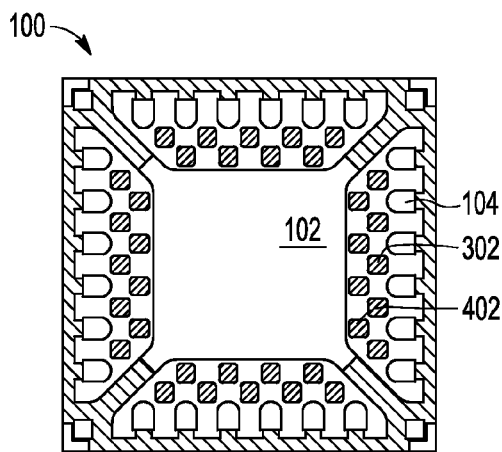
FIG. 5 shows a top view of another embodiment of the lead frame of FIG. 3 with another configuration of lead elements.

FIG. 5 shows the top view of the lead frame 100 of FIG. 3 with another configuration of lead elements 302, 502 placed in staggered rows around an inner portion of the lead frame 100. Staggering lead elements 302, 502 and terminals 104 may facilitate connecting lead elements 302, 502 and terminal 104 with bond pads (not shown) on IC dies or other components, especially when there are a high number of connections it is difficult to make wire bond connections that do not interfere with one another.

Lead elements 302, 402, 502 are placed on to the adhesive layer of tape 202 at desired locations in lead frame 100. An adhesive such as tape or glue can be pre-applied to lead elements 302, 402, 502 as alternative bonding method or to improve the bonding force in addition to adhesive layer of tape 202. Other techniques for attaching lead elements 302, 402, 502 to lead frame 100 can be used in addition to or instead of adhesive.

Figure 6:
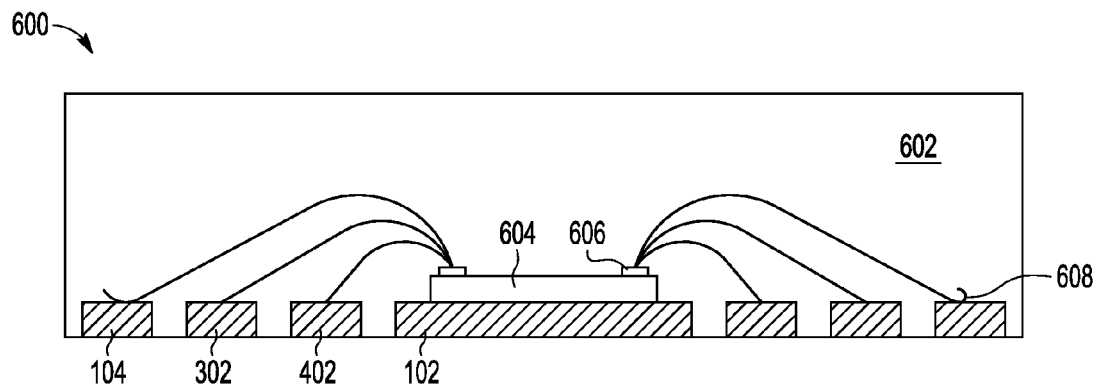
FIG. 6 shows a cross-sectional side view of a semiconductor package using the lead frame of FIG. 4 in a later stage of process after completion of assembly.

FIG. 6 shows a cross-sectional side view of a semiconductor package 600 using lead frame 100 of FIG. 4 with mold material 602 surrounding lead elements 302, 402, terminals 104, die pad 102, IC die 604 on top of die pad 102, die attach material (not shown), and wire bonds 608. Although package 600 is configured as a quad flat no lead package, the teachings described herein can be used to fabricate power quad flat no lead (PQFN) packages on a single gauge lead frame, dual flat no lead packages (DFN), and other types of packages on which additional lead elements 302, 402 can be used.

In the embodiment shown, bond pads 606 on IC die 604 are connected to lead elements 302, 402 and terminals 104 with wire bonds 608. Lead elements 302, 402, terminals 104, and wire bonds 608 are typically formed of a conductive material such as, for example, copper, gold, silver, platinum, or similar conductive material. Lead elements 302, 402 can also have different sizes (also referred to a lead pitches), as required.

Once IC die 604 or other active component(s) are attached to die pad 102 or on to the tape directly and one or more bond pads 606 via wire bond(s) 608, the components of package 600 are encapsulated utilizing mold material 602 that is typically a plastic or similar non-conductive material, and is utilized to protect package components such as IC die 604 and wire bonds 608.

Figure 7:
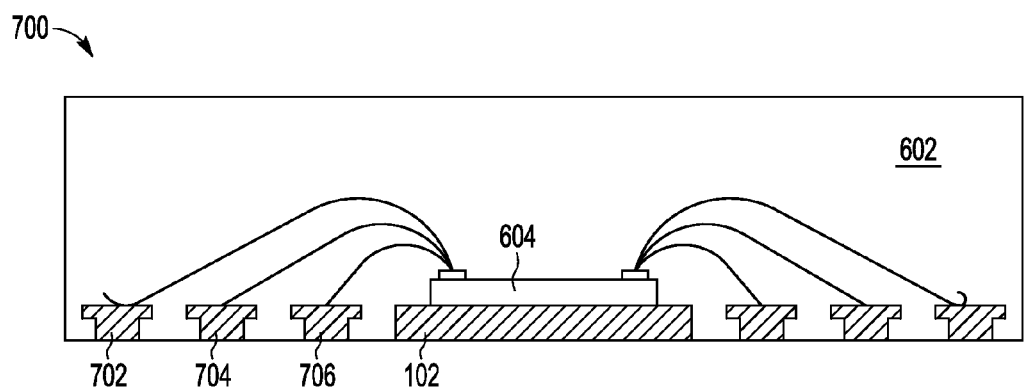
FIG. 7 shows a cross-sectional side view of another configuration of the semiconductor package using the lead frame of FIG. 4.

FIG. 7 shows a cross-sectional side view of another configuration of a semiconductor package 700 using lead frame 100 of FIG. 4 and partial etch lead elements 702 and placed partial etched lead elements 704 and 706. The etching may be performed with chemical etchants, or other methods, as is commonly known in the art. Partial etching refers to removing material from a section of a panel wherein less than the entire thickness of that section is removed. For example, a shallow or a deep recess may be formed in the partially etched section of the panel. A complete passageway through the substrate panel is not created during partial etching. Partial etching may be referred to as half-etching, especially when the depth of the etched section is approximately half the thickness of the panel. Partial etching is capable of removing material within tighter size tolerances because the width of an etched section can be decreased as the depth of the etched section to be etched decreases. Therefore, by partially etching lead elements 702, 704, 706 can be formed to have locking effect for lead elements 702, 704, 706 with encapsulation material. The techniques other than partial etching may also be applicable to create a structure similar to lead elements 702, 704, 706.

Figure 8:
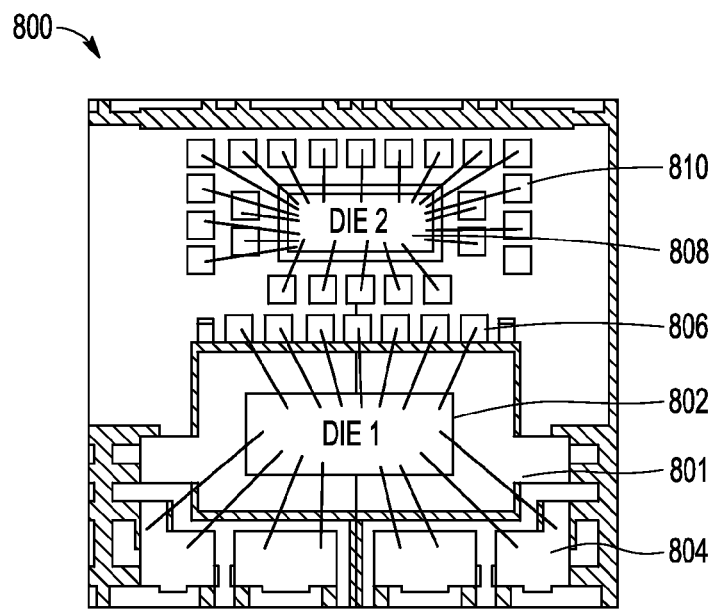
FIG. 8 shows a top view of another embodiment of a lead frame for a power QFN package.

FIG. 8 shows a top view of another embodiment of a lead frame 800 for a power QFN package. Lead frame 800 can have a standard thickness of approximately 8 mils or other suitable dimension. Lead frame 800 is shown with power IC die 802 wire bonded to terminals 804 and lead elements 806. The die pad 801, lead terminals 804, and lead elements 806, are placed in lead frame 800 after tape (not shown) is applied onto the back side of lead frame 800. The die pad 801, lead terminals 804 and lead elements 806 could be made of different material and thickness with lead frame 800 to meet thermal dissipation requirements of power die 802 and the requirements having high current pass through lead terminals 804 and lead elements 806. The connection from die 802 and die 808 could be formed if required. While there is one wire bond between IC die 802 and lead elements 806, terminals 804 are shown having more than one wire bond to power IC die 802 and are thus larger in size than lead elements 806. A second IC die 808 is coupled to lead elements 810 using individual wire bonds. Other configurations of IC dies, lead elements, and terminals are anticipated.

Figure 9:
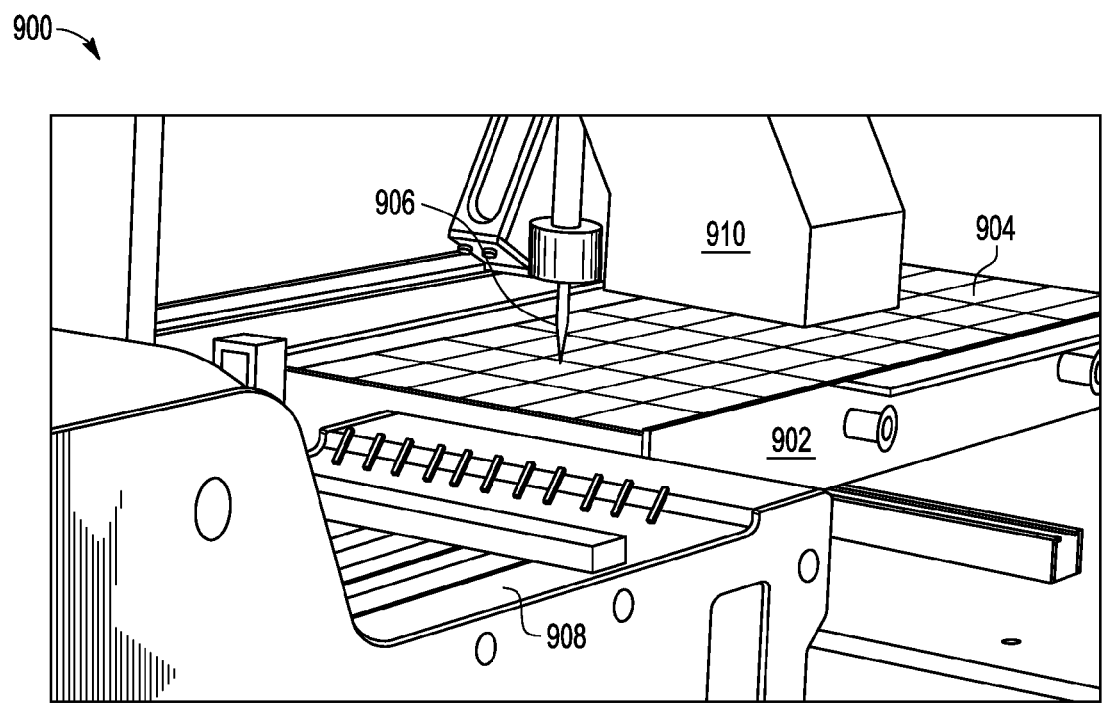
FIG. 9 shows a perspective view of an embodiment of an automated component placement system that can be used to add terminals to a lead frame for a semiconductor package.

FIG. 9 shows a perspective view of an embodiment of an automated component placement system 900 that can be used to add lead elements to a lead frame 904 for a semiconductor package. Automated Component Placement System (ACPS) 900 includes a conveyor 902 along which an array of lead frames 904 travel. Lead frames 904 can be processed individually or arranged in a one or two dimensional array to save time while adding surface components (not shown) to multiple lead frames 904. One or more pneumatic suction nozzles 906 are attached to a robotic head that is movable in three dimensions. Suction nozzles 906 can also be rotated 360 degrees. Surface mount components 912 such as terminals (not shown) are positioned on tape reels, or in chutes, trays and/or bins alongside conveyer 902 within reach of suction nozzle(s) 906. A sensor 910 can be included in system 900 to sense the position and orientation of lead frames 904 and/or surface mount components 912 to be picked and placed on lead frames 904. Surface mount components can include terminals, IC dies, and other suitable components. The Advantis pick and place system from Universal is one of suitable tools for the lead element placements. Other suitable pick and place systems are also available from providers such as Panasonic Corporation of Osaka, Japan, Siemens, and Technical Resources Corporation.

Tape adhesive layer can retain the die pad 801 and lead elements 302, 402, 806, 810 in position once die pad 801 and lead elements 302, 402, 806, 810 are placed on a lead frame. A supply of other components such as IC dies that is accessible by the automated component placement system can be provided to populate the lead frame(s). The component placement system 900 is operated to retrieve the components and place the components on the lead frame.

Figure 10:
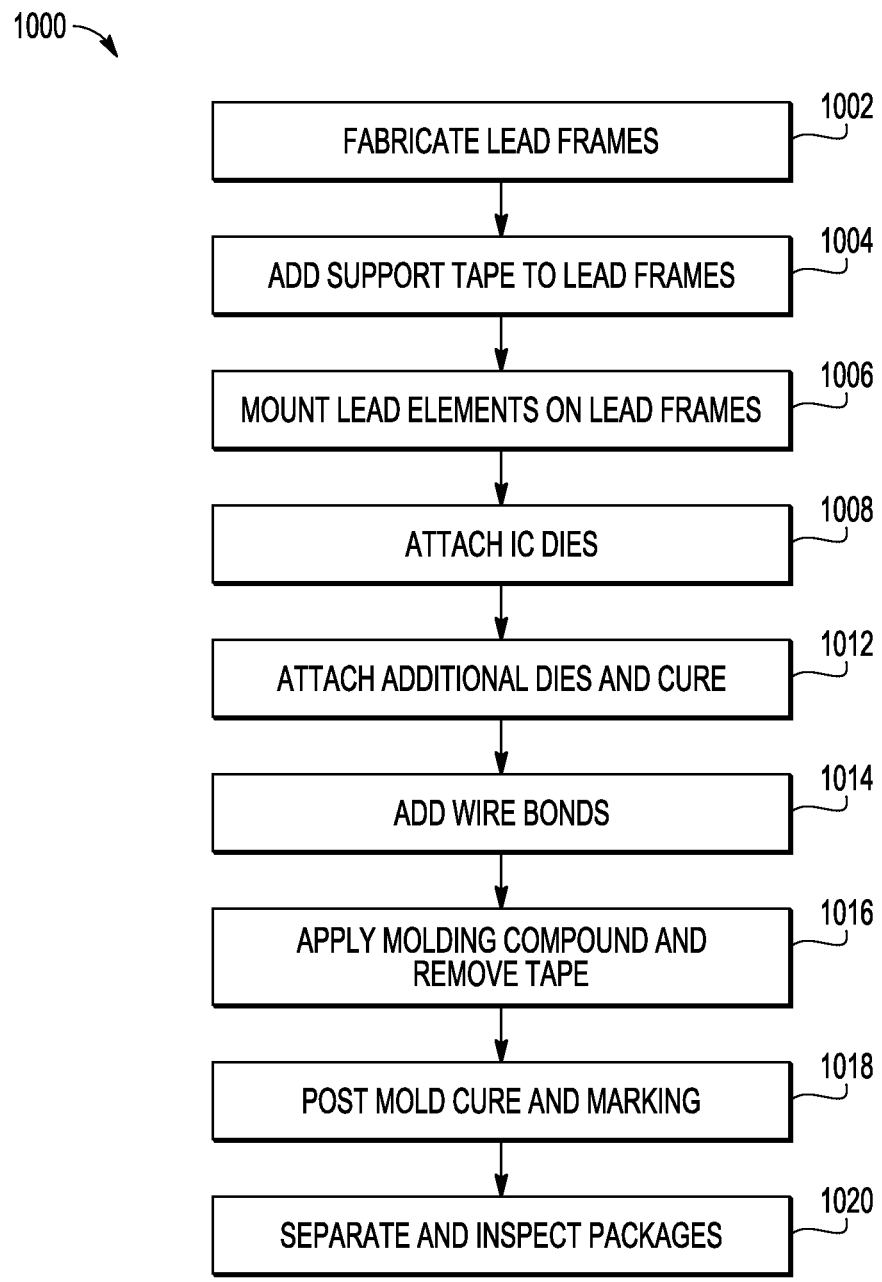
FIG. 10 shows an example sequence of manufacturing process steps which may be used for a lead frame and corresponding package in accordance with various embodiments of the present invention

FIG. 10 shows an example of a manufacturing process 1000 which may be used for a lead frame and corresponding package in accordance with various embodiments of the present invention, though it will be appreciated that there are many other variations. As depicted in FIG. 10, in process 1002 a single lead frame or a set (i.e. matrix) of lead frames is manufactured and patterned with one or more terminals. Tape can be attached to the lead frames to provide a support panel in process 1004 as well as receive the placed lead elements 302 and 402. In process 1006, additional lead elements are mounted on the lead frame before and/or after mounting one or more other components such as an IC die. The lead elements can have adhesive pre-applied as alternative bonding method of tape adhesive layer, or to improve the bonding force in addition to adhesive layer of tape 202.

In process 1008, the appropriate die attach material can be applied, the IC die(s) are placed into the die attach material, and then cured. If required, an epoxy or any other appropriate die attach material is applied, and additional IC dies are placed into the die attach material and/or a die attach cure is carried out in process 1012.

Wire bonds are applied, and a visual check is carried out in process 1014. A molding compound can be applied and the tape is removed in process 1016 to separate the support panel. The molding process can be carried out in various different ways, including mold pressing or other mold compound application methods. A post mold cure and laser marking steps are followed in process 1018. The packaged lead frames are then split into individual packages and inspected in process 1020.

The package could then be sent to final testing and then attached to a PCB or other device using a soldering process.

By now it should be appreciated that there has been provided a method for fabricating a semiconductor package that includes providing a supply of lead elements, mounting a plurality of the lead elements on a lead frame until a predetermined number of lead elements are placed on the lead frame, and connecting other components on the lead frame to the lead elements.

In other embodiments, the method can further include placing the lead elements in a row around an inner portion of the lead frame or placing the lead elements in multiple rows around an inner portion of the lead frame. The lead elements can be placed on the lead frame by an automated component placement system. The lead elements can be provided on tape and loaded on a reel apparatus on the component placement system. An adhesive can be applied to retain the lead elements in position once the lead elements are placed on the lead frame. The adhesive can be applied to the lead elements and/or the tape. The lead elements can be placed in staggered rows around an inner portion of the lead frame.

A supply of other components can be provided that is accessible by the component placement system. The component placement system can be operated to retrieve the components and place the components on the lead frame.

The package can be configured as a quad flat no lead (QFN) package, or a dual flat no lead (DFN) package, a power quad flat no lead (PQFN) package on a single gauge lead frame.

In further embodiments, a flat no lead semiconductor package is produced by a method comprising providing a lead frame, wherein the lead frame includes a plurality of pre-formed terminals; accessing a supply of isolated lead elements; and placing the lead elements on the lead frame. The lead elements can be placed in straight or staggered rows around the inner portion of the lead frame. Other components can be placed on the lead frame and wire bonded to the lead elements as well as terminals that were pre-formed on the lead frame. The package can be configured as a power quad flat no lead (PQFN) package on a single gauge lead frame, a quad flat no lead package (QFN), or a dual flat no lead (DFN) package. An automated component place system can be used to add the lead elements to the lead frame. The lead elements can be provided on a tape and reel apparatus that is accessible by the component placement system. The lead elements can include adhesive that retains the lead elements in position once the lead elements are placed on the lead frame or the tape.

In other embodiments, a method of fabricating a flat no lead semiconductor package comprises using an automated component placement system to access a supply of lead elements; and operating the component placement system to place the lead elements on a lead frame with preformed terminals. A supply of other components can be provided that is accessible by the automated component placement system. The component placement system can be operated to retrieve the other components and place the other components on the lead frame. The other components can then be connected to the lead elements and the terminals.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for fabricating a semiconductor package, the method comprising:
   providing a supply of lead elements;
   mounting a plurality of the lead elements on a lead frame until a predetermined number of lead elements are placed on the lead frame;
   connecting other components on the lead frame to the lead elements;
   providing a supply of other components that is accessible by a component placement system; and
   operating the component placement system to retrieve the other components and place the other components on the lead frame.

2. The method of claim 1 further comprising:
   placing the lead elements in a row around an inner portion of the lead frame.

3. The method of claim 1 further comprising:
   placing the lead elements in multiple rows around an inner portion of the lead frame.

4. The method of claim 1 wherein the lead elements have at least one of a group consisting of: different physical shape and dimensions, and are made from different materials.

5. The method of claim 1 wherein the package is configured as one of a group consisting of: a flat no lead package (FN), a power quad flat no lead (PQFN) package on a single gauge lead frame, a quad flat no lead (QFN) package, and a dual flat no lead (DFN) package.

6. The method of claim 1 further comprising:
   operating an automated component placement system to retrieve at least one of the lead elements and place the lead element on the lead frame.

7. The method of claim 1 further comprising:
   placing the lead elements in staggered rows around an inner portion of the lead frame.

8. The method of claim 6 wherein:
   the lead elements are on tape to load on a reel apparatus on the component placement system.

9. The method of claim 1 wherein:
   applying adhesive to retain the lead elements in position once the lead elements are placed on the lead frame, wherein the adhesive is applied to one of a group consisting of: the lead elements, a carrier, and tape attached to the lead frame.

10. A method of fabricating a flat no lead semiconductor package comprising:
    using an automated component placement system to access a supply of lead elements;
    operating the component placement system to place the lead elements on a lead frame with preformed terminals, wherein the method further comprising providing a supply of other components that is accessible by automated component placement system; operating the component placement system to retrieve the other components and place the components on the lead frame; and connecting the other components to lead elements and the terminals.

* * * * *